(12) United States Patent
Pastor et al.

(10) Patent No.: US 6,278,158 B1
(45) Date of Patent: Aug. 21, 2001

(54) VOLTAGE VARIABLE CAPACITOR WITH IMPROVED C-V LINEARITY

(75) Inventors: Rickey G. Pastor; Lei Zhao, both of Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/474,681

(22) Filed: Dec. 29, 1999

(51) Int. Cl.[7] .................. H01L 27/01; H01L 27/12; H01L 31/0392; H01L 29/93; H01L 29/94

(52) U.S. Cl. ................ 257/347; 257/595; 257/295; 257/310

(58) Field of Search ............................. 257/347–354, 257/295, 310

(56) References Cited

U.S. PATENT DOCUMENTS 5,965,912 * 10/1999 Stolfa et al. .................... 257/312
6,072,208 * 6/2000 Nishihara ....................... 257/296
6,172,378 * 1/2001 Hull et al. ....................... 257/14

\* cited by examiner

*Primary Examiner*—Eddie Lee
*Assistant Examiner*—Jesse A. Fenty
(74) *Attorney, Agent, or Firm*—William E. Koch

(57) ABSTRACT

A voltage variable capacitor includes a supporting substrate with a doped layer, an insulating layer positioned on the doped layer, and first, second, and third conductive segments positioned on the insulating layer parallel to the doped layer and spaced from the doped layer by the insulating layer so as to define first, second, and third capacitors. The first, second, and third conductive segments serve as external contacts and the opposed terminals of the first, second, and third capacitors are coupled together through the doped layer. In a preferred embodiment, the substrate is a semiconductor wafer and the doped layer is epitaxially grown. The insulating layer is a high dielectric constant material, such as zirconium titanate or material with a similar dielectric constant and the segments are gold.

15 Claims, 2 Drawing Sheets

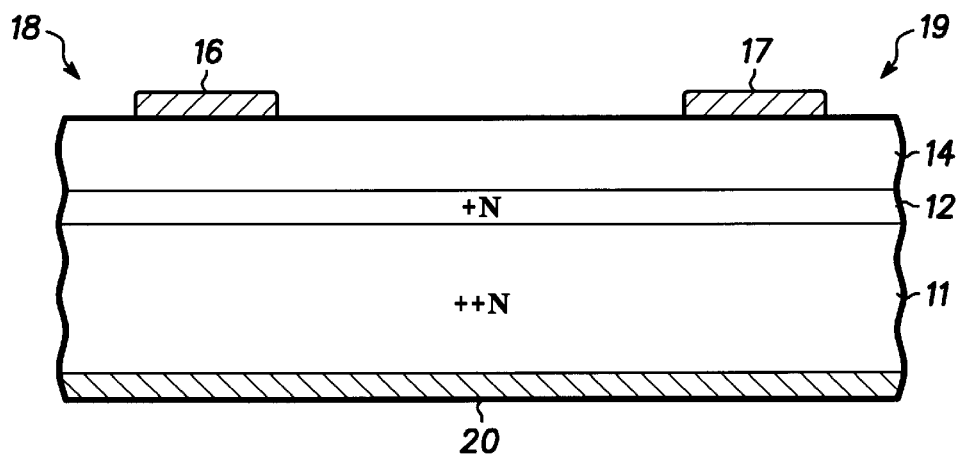
FIG. 1  *10*  — *PRIOR ART* —
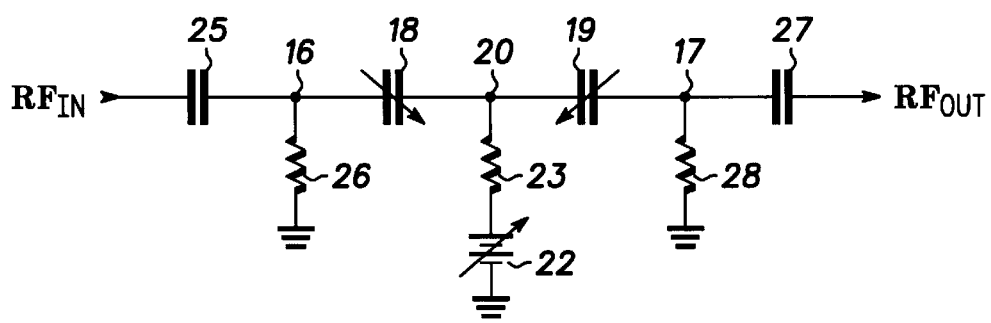
FIG. 2  — *PRIOR ART* —
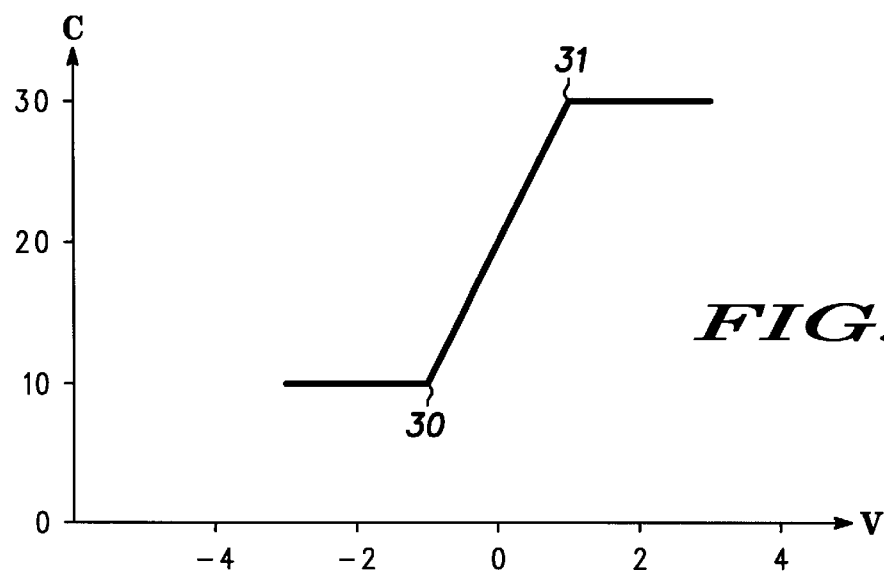
FIG. 3

US 6,278,158 B1

VOLTAGE VARIABLE CAPACITOR WITH IMPROVED C-V LINEARITY

FIELD OF THE INVENTION

This invention relates to voltage variable capacitors with improved C-V linearity and to methods of fabricating the improved voltage variable capacitors.

BACKGROUND OF THE INVENTION

As is known in the art, voltage variable capacitors (VVC) are formed using standard semiconductor processes and techniques. In general, a semiconductive layer is formed on a semiconductor substrate by forming a doped layer on the surface of the substrate. An insulating layer is then formed on the surface of the doped layer and a pair of RF capacitors are formed by depositing two spaced apart metal contacts on the surface of the insulating layer. Each contact forms a capacitor in conjunction with the underlying semiconductive layer. The two spaced apart metal contacts are I/O contacts for the VVC and opposite contacts for each of the capacitors are connected together and to the back side of the substrate by the semiconductive layer.

The VVC is connected into a circuit by connecting a first variable DC voltage between the back side of the substrate and one of the two spaced apart metal contacts and a second variable DC voltage between the back side of the substrate and the other of the two spaced apart metal contacts. Generally, the two variable voltages are the same and are supplied by one voltage supply. The VVC has a typical S-shaped capacitor-voltage (C-V) waveform. The problem is that the C-V waveform has breaks or very sharp corners (i.e. $C_{min}$ and $C_{max}$) in it which produce irregularities in the inter-modulation (IM) performance. Also the linear portion of the curve (between Cmin and Cmax) is relatively short which reduces the linearity of the VVC. Additionally, the electrical connection to the back side of the semiconductor substrate causes connection difficulties in some applications, e.g. flip chip applications and the like. Also, the need to provide an electrical contact on the back side of the substrate causes additional process steps and cost in the fabrication.

Accordingly it is highly desirable to provide apparatus which overcomes or reduces these problems and an improved method of fabrication.

BRIEF DESCRIPTION OF THE DRAWINGS

Referring to the drawings:

FIG. 1 is a sectional view of a typical voltage variable capacitor;

FIG. 2 is a schematic diagram of the voltage variable capacitor illustrated in FIG. 1, with external components connected in an operative mode;

FIG. 3 is a graphical representation of the capacitor-voltage waveform of the voltage variable capacitor of FIG. 1;

DESCRIPTION OF THE PREFERRED EMBODIMENT

Figure 4:
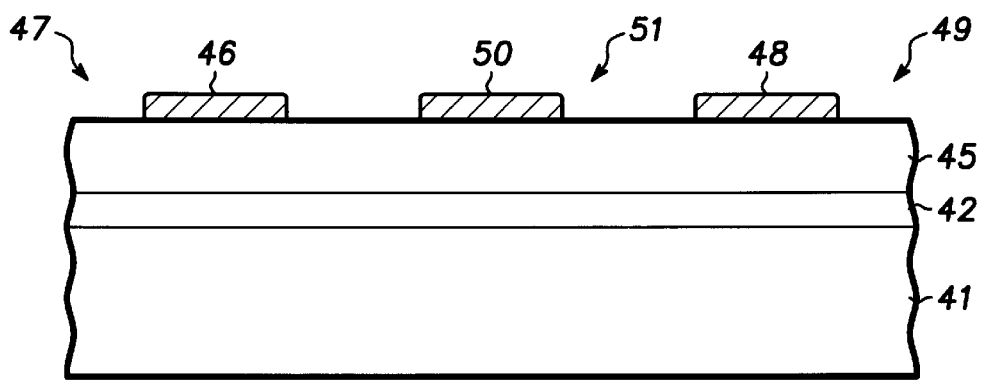
FIG. 4 is a sectional view of a voltage variable capacitor in accordance with the present invention.

Turning now to the drawings and specifically to FIG. 1, in which a sectional view of a typical voltage variable capacitor (VVC) 10 is illustrated. VVC 10 includes a heavily doped semiconductor substrate 11 having a lighter doped semiconductor layer 12 formed on the upper surface thereof. An insulating layer 14, typically formed of zirconium titanate, is deposited over semiconductor layer 12. Metal contacts 16 and 17 are deposited on the surface of insulating layer 14 and form a first voltage variable capacitive component 18 and a second voltage variable component 19.

As is understood by those skilled in the art, the doping of layer 12 and the characteristics of layer 14 (e.g. thickness, dielectric constant, etc.) generally controls the value of $C_{min}$ while the characteristics of layer 14 (e.g. thickness, dielectric constant, etc.) generally determine $C_{max}$ for VVC 10. Generally, layers 12 and 11 define one plate of capacitive component 18 and metal contact 16 forms another plate with insulating layer 14 disposed therebetween. Similarly, layer 12 forms one plate of capacitive component 19 and metal contact 17 forms another plate with insulating layer 14 disposed therebetween. Thus, layer 12 is a common contact for both capacitive component 18 and capacitive component 19, which common contact is electrically accessible by means of a metal layer 20 deposited on the back side of substrate 11.

Referring additionally to FIG. 2, a schematic diagram of VVC 10 is illustrated with external connections and components placing it in an operative mode. Voltage variable capacitive component 18 is illustrated as being connected between external metal contact 16 and the common external contact or metal layer 20 and voltage variable capacitive component 19 is illustrated as being connected between external metal contact 17 and the common external contact or metal layer 20. One terminal of an external variable voltage source 22 is connected through an RF blocking resistor 23 to the external metal contact or metal layer 20 and the other terminal of source 22 is connected to ground. An RF coupling capacitor 25 is connected from an RFin terminal to external metal contact 16 and an RF blocking resistor 26 is connected from external metal contact 16 to ground. Similarly, an RF coupling capacitor 27 is connected from an RFout terminal to external metal contact 17 and an RF blocking resistor 28 is connected from external metal contact 17 to ground.

In the operating mode, voltage source 22 is variable between +2 and −2 volts. Here it will be understood that the voltage range +2 and −2 volts is relatively common and will be used throughout this discussion for purposes of example. However, larger or smaller ranges can be used in specific applications and it is even not uncommon to simply switch between the flat areas beyond $C_{min}$ and $C_{max}$ to produce a switching type of device. The capacitor-voltage (C-V) waveform for VVC 10 is illustrated graphically in FIG. 3. As contact 16, for example, is biased positive by voltage source 22, electrons are attracted to the upper surface of semiconductive layer 12 (see FIG. 1) below metal contact 16. As contact 16 is biased negative by voltage source 22, electrons are repelled and a depletion area is formed adjacent to the upper surface of semiconductive layer 12 (see FIG. 1) below metal contact 16. The number of electrons attracted or repelled is determined by the amount of bias voltage applied and determines the apparent capacity of VVC 10.

In a typical application, RF coupling capacitor 25 couples RF signals from a source (not shown) to the input external contact, metal contact 16 of VVC 10. The RF signals pass directly through VVC 10 to the output external contact, metal contact 17, and are coupled to a load (not shown) by RF coupling capacitor 27. RF blocking resistors 23, 26, and 28 essentially block RF signals front entering the DC bias circuits so that VVC 10 looks to the RF circuit as though it is a pure capacitance. The capacitance-voltage waveform for VVC 10, illustrated in FIG. 3, shows that the minimum capacitance of VVC 10, generally denoted by break 30 in the waveform, is reached before the variable voltage is reduced to a −2 volts. Similarly, the maximum capacitance of VVC 10, generally denoted by break 31 in the waveform, is reached before the variable voltage is increased to a +2 volts. Breaks 30 and 31 in the waveform produce inter-modulation (IM) problems and the flattened portions of the waveform produce control problems because additional control voltage applied to VVC 10 beyond either $C_{min}$ or $C_{max}$ does not produce appreciable capacitance changes. However, as explained briefly above, it is not uncommon to simply switch between the flat areas beyond $C_{min}$ and $C_{max}$ to provide a switching action.

Turning now to FIG. 4, a sectional view is illustrated of a voltage variable capacitor (VVC) 40 in accordance with the present invention. VVC 40 includes a supporting substrate 41 having a doped semiconductive layer 42 positioned thereon. To make the fabrication process simple and in conformance with standard semiconductor techniques, in this preferred embodiment supporting substrate 41 is a semiconductor substrate. As will be understood more clearly from the description below, it is desirable to dope supporting substrate 41 for conductivity because RF passing through VVC 40 is carried partially by supporting substrate 41 and, therefore, the Q of the device can be improved by providing a lower resistance path through VVC 40. In this preferred embodiment, substrate 41 is monocrystalline silicon, however other materials such as polycrystalline silicon, silicon carbide, gallium arsenide, etc. can be used if desired or appropriate for the specific application. Also, layer 42 is epitaxially grown on substrate 41 and for purposes of this disclosure is considered to be a portion of the substrate. It will of course be understood that additional layers may be included in substrate 41 if appropriate for the specific application, and layer 42 could be formed by some other method, as for example doping of substrate 41 to provide the desired conductivity.

A layer 45 of insulating material is positioned, as for example by deposition, on the surface of layer 42 so as to provide a layer of substantially uniform thickness. The insulating material forming layer 45 is generally a high dielectric constant material, such as zirconium titanate or material with a similar or higher dielectric constant. As understood by those skilled in the art, the high dielectric constant provides better insulation which in turn provides less leakage and a higher breakdown voltage. It will of course be understood that any insulating material which achieves the desired objectives can be used in layer 45.

A conductive segment 46 is positioned on the surface of insulating layer 45 parallel to layer 42 and spaced from layer 42 by insulating layer 45 so as to define a first, capacitor 47. A conductive segment 48 is positioned on the surface of insulating layer 45 parallel to layer 42 and spaced from layer 42 by insulating layer 45 so as to define a second, capacitor 49. Also, a third conductive segment 50 is positioned on the surface of insulating layer 45 parallel to layer 42 and spaced from layer 42 by insulating layer 45 so as to define a third, capacitor 51. In addition to forming one plate for each capacitor 47, 49, and 51, each segment 46, 48, and 50 provides an external contact for VVC 40. Segments 46, 48, and 50 are generally formed of metal or other good conductive material and in this preferred embodiment are formed of gold because it is a good electrical conductor. Generally, a thin layer of NiCr may be used to improve adhesion between the gold contact and insulating layer 45. The opposite contacts of capacitors 47, 49, and 51 are all connected in common by layer 42.

Figure 5:
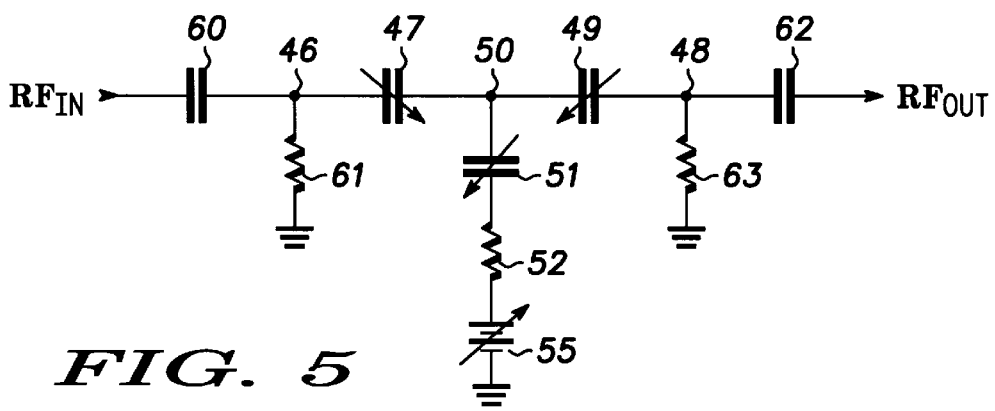
FIG. 5 is a schematic diagram of the voltage variable capacitor of FIG. 4, with external components connected in an operative mode.

Referring additionally to FIG. 5, a schematic diagram is illustrated of VVC 40 connected in an operative mode. Segments 46, 48, and 50 are illustrated as external terminals with capacitor 47 connected between terminals 46 and 50 and capacitor 49 connected between terminals 48 and 50. One side of capacitor 51 is connected to terminal 50 and the other side is connected through an RF blocking resistor 52 to one side of an external variable voltage source 55. The opposite side of variable voltage source 55 is connected to a common potential, such as ground. Thus, source 55 acts as a first variable voltage across voltage variable capacitor 47 and as a second variable voltage across voltage variable capacitor 49. Two separate voltage sources could be used in place of the single source 55, if desired.

An RF coupling capacitor 60 is connected from an RFin terminal to external metal contact 46 and an RF blocking resistor 61 is connected from external metal contact 46 to the common potential (e.g. ground). Similarly, an RF coupling capacitor 62 is connected from an RFout terminal to external metal contact 48 and an RF blocking resistor 63 is connected from external metal contact 48 to ground. In a typical application, RF coupling capacitor 60 couples RF signals from a source (not shown) to the input external contact, segment 46 of VVC 40. The RF signals pass directly through VVC 40 to the output external contact, segment 48, and are coupled to a load (not shown) by RF coupling capacitor 62.

Here it should be noted that variable capacitor 51 can be fabricated in a range from larger than capacitors 47 and 49 (e.g. no greater than ten times larger) to a capacitance which is smaller than capacitors 47 and 49. As capacitor 51 is increased in size its effect disappears and the circuit of FIG. 5 approaches (becomes similar to) the circuit of FIG. 2. That is, in the circuit capacitors 47 and 51 are in series and capacitors 49 and 51 are in series. Since the total capacitance of capacitors in series is determined by the product of the capacitances divided by the sum, the capacitance of the series connected capacitors 47 and 51 is substantially equal to the capacitance of capacitor 47 and, similarly, the capacitance of the series connected capacitors 49 and 51 is substantially equal to the capacitance of capacitor 49. It will be understood, however, that the values of capacitors 47 and 49 and capacitor 51 can be easily varied, as for example by varying the area of segments 46, 48, and 50, to achieve a degree of linearity needed to produce a required inter-modulation while maintaining the necessary capacitance tuning range.

Figure 6:
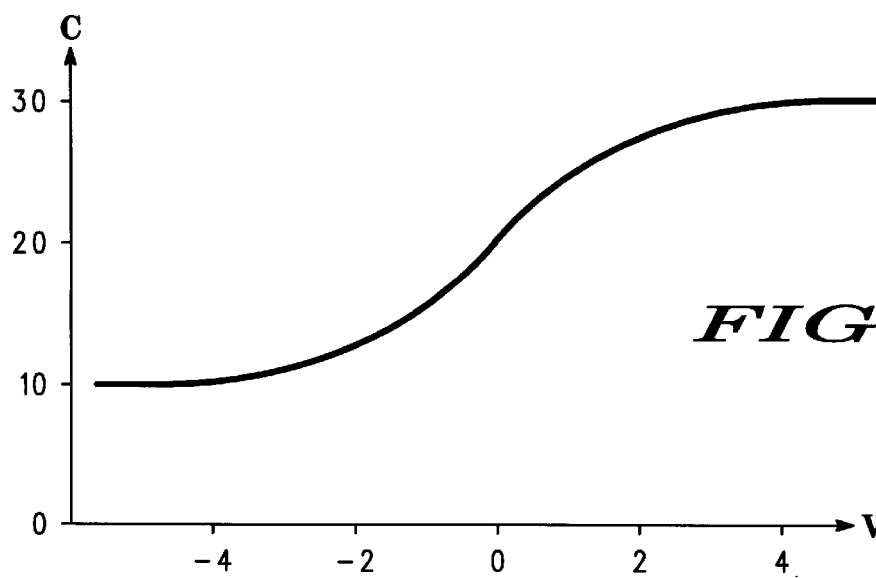
FIG. 6 is a graphical representation of the capacitor-voltage waveform of the voltage variable capacitor of FIG. 4.

The capacitance-voltage waveform for VVC 40, is illustrated in FIG. 6 and shows that the minimum and maximum capacitances ($C_{min}$ and $C_{max}$) of VVC 40 are generally similar to the minimum and maximum capacitances of VVC 10 (FIG. 1). Here it will be understood that the voltage range +2 and −2 volts is relatively common and will be used throughout this discussion for purposes of example. However, larger or smaller ranges can be used in specific applications and it is even not uncommon to simply switch between the flat areas beyond $C_{min}$ and $C_{max}$ to produce a switching type of device. It should be noted that no break is present in the C-V waveform for VVC 40. The linear portion of the waveform extends well beyond the +2 volt and −2 volt bias points so that control of the capacitance of VVC 40 is never changed or reduced throughout the range and the range is substantially improved. Also, since there are no sharp breaks or flat areas in the waveform inter-modulation performance is improved. An additional point to notice is that no electrical connections are required or used on the back side of substrate 41, which improves the connection of VVC 40 into standard integrated circuits and into applications requiring flip-chips and the like.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A voltage variable capacitor comprising:

a supporting substrate including a doped layer defining a surface;

an insulating layer positioned on the doped layer and defining a surface; and first, second, and third conductive segments positioned on the surface of the insulating layer parallel to the doped layer and spaced from the doped layer by the insulating layer so as to define first, second, and third capacitors, the first, second, and third conductive segments defining external terminals of the first, second, and third capacitors, opposed terminals of the first, second, and third capacitors being coupled together through the doped layer.

2. A voltage variable capacitor as claimed in claim 1 wherein the supporting substrate includes silicon.

3. A voltage variable capacitor as claimed in claim 1 wherein the doped layer is an epitaxial layer grown on the supporting substrate.

4. A voltage variable capacitor as claimed in claim 1 wherein the insulating layer is a material with a high dielectric constant.

5. A voltage variable capacitor as claimed in claim 4 wherein the material with the high dielectric constant includes zirconium titanate.

6. A voltage variable capacitor as claimed in claim 4 wherein the first, second, and third conductive segments are metal.

7. A voltage variable capacitor as claimed in claim 6 wherein the metal includes gold.

8. A voltage variable capacitor as claimed in claim 1 wherein the third capacitor is no larger than ten times the first and second capacitors.

9. A voltage variable capacitor as claimed in claim 1 wherein the first and third conductive segments have a first variable DC voltage coupled thereto whereby the first and third capacitors are connected in a first series circuit with the first variable DC voltage, the second and third conductive segments have a second variable DC voltage coupled thereto whereby the second and third capacitors are connected in a second series circuit with the second variable DC voltage, and the first conductive segment defines a first external terminal for the voltage variable capacitor, and the second conductive segment defines a second external terminal for the voltage variable capacitor.

10. A voltage variable capacitor comprising:

a semiconductor substrate including a doped epitaxial layer defining a surface;

a high dielectric constant insulating layer positioned on the doped epitaxial layer and defining a surface;

first, second, and third metal segments positioned on the surface of the insulating layer parallel to the doped epitaxial layer and spaced from the doped epitaxial layer by the insulating layer so as to define first, second, and third capacitors, the first, second, and third metal segments defining external terminals of the first, second, and third capacitors, opposed terminals of the first, second, and third capacitors being coupled together through the doped epitaxial layer;

a first variable DC voltage coupled to the first and third metal segments so as to connect the first and third capacitors in a first series circuit with the first variable DC voltage; and a second variable DC voltage coupled to the second and third metal segments so as to connect the second and third capacitors in a second series circuit with the second variable DC voltage;

whereby the first metal segment defines a first external terminal for the voltage variable capacitor, and the second metal segment defines a second external terminal for the voltage variable capacitor.

11. A voltage variable capacitor as claimed in claim 10 wherein the semiconductor substrate includes silicon.

12. A voltage variable capacitor as claimed in claim 10 wherein the high dielectric constant insulating material includes zirconium titanate.

13. A voltage variable capacitor as claimed in claim 10 wherein the first, second, and third metal segments include gold.

14. A voltage variable capacitor as claimed in claim 10 wherein the third capacitor is no larger than ten times the first and second capacitors.

15. A voltage variable capacitor as claimed in claim 10 wherein the first external terminal and the second external terminal are connected as input/output terminals for RF signals.

* * * * *